ically, an output voltage level being obtained from the output terminal in accordance with an input signal voltage level supplied to the input terminal; and a current mirror circuit operating so that a first current flows through the first transistor in proportion to a second current flowing through the second transistor, the value of the second current is determined in accordance with the output voltage level and a value of a load connected between the output terminal and the second power supply terminal; and thereby, a voltage level supplied to the gates (or bases) of the first and second transistors is varied in accordance with the value of the second current. The above semiconductor integrated circuit may also be used as a constant current output circuit by providing an output terminal in one of the transistors of the current mirror circuit, for supplying a predetermined constant current, and connecting a variable resistor instead of the above load.

United States Patent [19]

Kousaka et al.

[11] Patent Number: 4,697,154
[45] Date of Patent: Sep. 29, 1987

[54] SEMICONDUCTOR INTEGRATED CIRCUIT HAVING IMPROVED LOAD DRIVE CHARACTERISTICS

[75] Inventors: Kunimitsu Kousaka, Kawasaki; Kunihiko Gotoh, Kunitachi, both of Japan

[73] Assignee: Fujitsu Limited, Kawasaki, Japan

[21] Appl. No.: 839,027

[22] Filed: Mar. 12, 1986

[30] Foreign Application Priority Data

Mar. 18, 1985 [JP] Japan ................. 60-052478

[51] Int. Cl.[4] ............................. H03F 3/18
[52] U.S. Cl. ................... 330/277; 323/315; 330/288
[58] Field of Search ........... 330/257, 288, 290, 277; 323/315, 316; 307/297

[56] References Cited

U.S. PATENT DOCUMENTS 4,442,398 4/1984 Bertails et al. ............... 323/315
4,450,367 5/1984 Whatley ....................... 307/297
4,477,737 10/1984 Ulmer et al. .................. 307/297

Primary Examiner—James B. Mullins
Attorney, Agent, or Firm—Staas & Halsey

[57] ABSTRACT

The semiconductor integrated circuit includes a first power supply terminal and a second power supply terminal; a first transistor and a second transistor having gates (or bases) connected in common; an input terminal and an output terminal connected to each source (or each emitter) of the first and second transistors, respec- 4 Claims, 6 Drawing Figures

SEMICONDUCTOR INTEGRATED CIRCUIT HAVING IMPROVED LOAD DRIVE CHARACTERISTICS

BACKGROUND OF THE INVENTION (1) Field of the Invention

The present invention relates to a semiconductor integrated circuit having improved load drive characteristics. More particularly, it relates to a semiconductor integrated circuit comprising an analog buffer amplifier able to output a predetermined voltage level in accordance with an input signal voltage level irrespective of a value of a load, without consuming high power. Also, it relates to a semiconductor integrated circuit comprising a constant current output circuit utilizing the above analog buffer amplifier, able to output a predetermined constant current in accordance with a constant input signal voltage level and a resistance value of a variable resistor connected from outside of a chip to a predetermined terminal of the circuit.

(2) Description of the Related Art

Generally, a conventional semiconductor integrated circuit used as an analog buffer amplifier comprises a differential stage and an output stage, and an input signal having a voltage level $V_{in}$ is input to a input terminal provided in the differential stage.

When the input signal level $V_{in}$ rises, the output voltage level of the differential stage falls, and this lower voltage level is then inverted by the output stage. As a result, an output voltage having a voltage level $V_{out}$, which is nearly equal to the input signal voltage level $V_{in}$, is output from the output stage irrespective of the value of a load connected to an output terminal provided in the output stage.

However, in the above-mentioned conventional analog buffer amplifier, the output voltage $V_{out}$ of the output stage is fed back to the differential stage, and as a result, oscillation may occur if the frequency characteristics of the load L are in a predetermined condition.

Therefore, a capacitor is provided in the output stage to correct the phase of the output voltage $V_{out}$ and prevent the above oscillation.

As a result, a large area in the semiconductor integrated circuit is occupied by the capacitor, and thus a problem arises in that the total area needed for the layout of the semiconductor integrated circuit tends to increase. In this connection, if the capacitor is small in size, the range of the load which can be driven by the analog buffer amplifier is limited.

Further, in the above conventional semiconductor integrated circuit, a constant current flows through constant current sources provided in the differential stage and the output stage, irrespective of the value of the load driven by the analog buffer amplifier. Particularly, in the constant current source provided in the output stage, it is necessary to determine the value of the constant current flowing through the constant current source by taking into consideration the value of the constant current flowing when the maximum load is driven.

As a result, another problem arises in that the constant current value is always equal to the value needed when the maximum load is driven, and thus power is wasted.

SUMMARY OF THE INVENTION

The present invention has been completed to solve the above-mentioned problems, and the object of the present invention is to provide an analog buffer amplifier constructed without the provision of the feed-back circuit, and thus to reduce the total area needed for the layout of the semiconductor integrated circuit by omitting the above capacitor for correcting the phase. Another object of the present invention is to provide a low-power analog buffer amplifier able to regulate the total current supplied from a power supply source in accordance with a value of a load driven by the analog buffer amplifier, and thus to reduce the consumption of power. A further object of the present invention is to increase an input impedance of the analog buffer amplifier in a usual mode and to reduce needed drive ability or capacity of a system provided for driving the analog buffer amplifier.

A still further object of the present invention is to construct a constant current output circuit by utilizing the above analog buffer amplifier, and to provide a constant current output circuit having the same advantages as those of the above analog buffer amplifier, and able to output a predetermined constant current with a high accuracy and high stability in accordance with a resistance value of a variable resistor connected from outside of a chip to a predetermined terminal of the circuit.

To attain these objects, according to one embodiment of the present invention, there is provided a semiconductor integrated circuit comprising a first power supply terminal means and a second power supply terminal means; a first transistor and a second transistor having gates (or bases) connected in common; an input terminal means and an output terminal means connected to each source (or each emitter) of the first and second transistors, respectively, an output voltage level being obtained from the output terminal means in accordance with an input signal voltage level supplied to the input terminal means; and a current mirror circuit operating so that a first current flows through the first transistor in proportion to a second current flowing through the second transistor, the value of the second current is determined in accordance with the output voltage level and a value of a load connected between the output terminal means and the second power supply terminal means, and a voltage level supplied to the gates (or bases) of the first and second transistors is varied in accordance with the value of the second current.

According to another embodiment of the present invention, there is provided a semiconductor integrated circuit comprising a first power supply terminal means and a second power supply terminal means; a first transistor and a second transistor having gates (or bases) connected in common; an input terminal means and another terminal means connected to each source (or each emitter) of the first and second transistors, respectively, a constant voltage level being obtained from the another terminal means in accordance with a constant input signal voltage level supplied to the input terminal means; and a current mirror circuit having an output terminal means and operating so that a first current flows through the first transistor in proportion to a second current flowing through the second transistor, the value of the second current is determined in accordance with the constant voltage level and a resistance value of a variable resistor connected between that another terminal means and the second power supply terminal means, a voltage level supplied to the gates (or bases) of the first and second transistors is varied in accordance with the value of the second current, and a predetermined constant current is output from the output terminal means in accordance with the value of the second current.

According to one embodiment of the present invention, the semiconductor integrated circuit operates so that the output voltage level obtained from the source (or the emitter) of the second transistor is determined in accordance with the value of the input signal voltage level supplied to the source (or the emitter) of the first transistor, and the current mirror circuit makes the value of the first current proportional to the value of the second current (namely, the load current), and thus the voltage level supplied to the gates (or bases) of the first and second transistors is varied in accordance with the value of the second current so as to supply enough current from the power supply source to drive the load.

According to another embodiment of the present invention, the semiconductor integrated circuit operates so that the constant output voltage level (D.C. voltage level) is obtained from the source (or the emitter) of the second transistor in accordance with the value of the predetermined constant input signal voltage level (D.C. voltage level) supplied to the source (or the emitter) of the first transistor, and the current mirror circuit makes the value of the first current proportional to the value of the second current (namely, the current flowing through the variable resistor), and thus the voltage level supplied to the gates (or bases) of the first and second transistors is varied in accordance with the value of the second current and the predetermined constant current is output from the output terminal provided in the current mirror circuit in accordance with the value of the second current.

DESCRIPTION OF THE PREFERRED EMBODIMENTS

Figure 1:
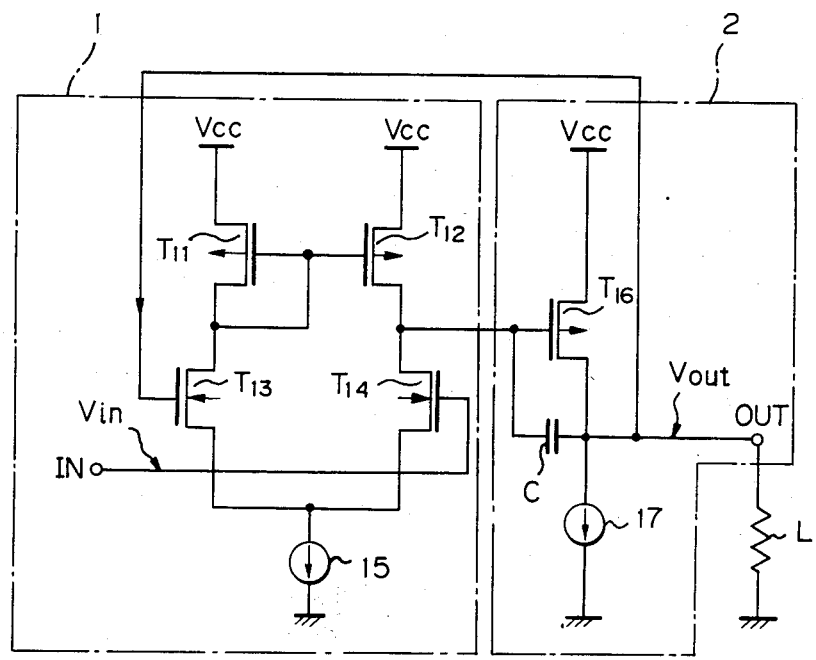
FIG. 1 is a circuit diagram illustrating an example of a conventional semiconductor integrated circuit used as an analog buffer amplifier.

To clarify the background of the present invention, an example of a conventional semiconductor integrated circuit used as an analog buffer amplifier is shown in FIG. 1.

As shown in FIG. 1, the analog buffer amplifier comprises a differential stage 1 and an output stage 2. The differential stage 1 comprises a pair of P channel type transistors $T_{11}$ and $T_{12}$ having gates connected to a drain of the transistor $T_{11}$, a pair of N channel type transistors $T_{13}$ and $T_{14}$ having sources connected in common, and a constant current source 15 connected between the sources of the transistors $T_{13}$ and $T_{14}$ and the earth potential. The output stage 2 comprises a P channel type transistor $T_{16}$ and a constant current source 17 connected between a drain of the transistor $T_{16}$ and the earth potential. An input signal having a voltage level $V_{in}$ is input to a input terminal IN connected to a gate of the transistor $T_{14}$ provided in the differential stage 1. Further, a voltage level of a drain of the transistor $T_{14}$ is supplied to a gate of the transistor $T_{16}$ provided in the output stage 2, and an output voltage $V_{out}$ obtained from the drain of the transistor $T_{16}$ is fed back to a gate of the transistor $T_{13}$ provided in the differential stage 1.

Thus, if the input signal level $V_{in}$ supplied to the gate of the transistor $T_{14}$ rises, the voltage level of the drain of the transistor $T_{14}$ falls, and this lower voltage level is then inverted by the transistor $T_{16}$. As a result, the output voltage having the voltage level $V_{out}$, which is nearly equal to the input signal voltage level $V_{in}$, is output from the drain of the transistor $T_{16}$ (namely, from an output terminal OUT) irrespective of the value of a load L connected between the output terminal OUT and the earth potential. Thus, the ability for driving the load is increased at the output side of the output stage 2.

However, as above-mentioned, in the above analog buffer amplifier, the output voltage $V_{out}$ is fed back to a gate of the transistor $T_{13}$, and as a result, oscillation may occur if the frequency characteristics of the load L are in a predetermined condition.

Therefore, as shown in FIG. 1, a capacitor C is connected between each gate and drain of the transistor $T_{16}$, to correct the phase of the output voltage $V_{out}$ and prevent this oscillation. As a result, a large area in the semiconductor integrated circuit is occupied by the capacitor, and thus a problem arises in that the total area needed for the layout of the semiconductor integrated circuit tends to increase. In this connection, if the capacitor C is small in size, the range of the load which can be driven by the analog buffer amplifier becomes limited.

Further, in the above conventional semiconductor integrated circuit, a constant current flows through the constant current sources, irrespective of the value of the load driven by the analog buffer amplifier. Particularly, in the constant current source 17 provided in the output stage 2, it is necessary to determine the value of the constant current flowing through the constant current source by taking into consideration the value of the constant current flowing when the maximum load is driven. As a result, another problem arises in that the constant current value becomes always equal to the value needed when the maximum load is driven, and thus power is wasted.

Figure 2:
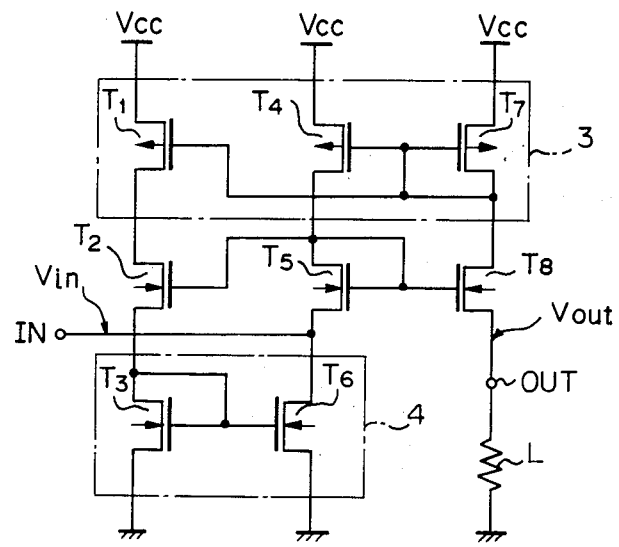
FIG. 2 is a circuit diagram illustrating a first embodiment of the semiconductor integrated circuit according to the present invention.

FIG. 2 shows a circuit diagram illustrating a first embodiment of the semiconductor integrated circuit, according to the present invention, by which these problems are solved.

As shown in FIG. 2, the semiconductor integrated circuit according to the first embodiment of the present invention, comprises a pair of N channel type transistors $T_5$ and $T_8$ having gates connected to a drain of the transistor $T_5$, and an input terminal IN is connected to a source of the transistor $T_5$. Thus, each gate voltage of the transistors $T_5$ and $T_8$ becomes almost equal to $(V_{in}+V_{th})$, where $V_{in}$ and $V_{th}$ correspond to a voltage level supplied to the input terminal IN and a threshold voltage of the transistors $T_5$ and $T_8$, respectively.

As a result, the output voltage level $V_{out}$ obtained from a source of the transistor $T_8$ (namely, from an output terminal OUT) becomes equal to the input voltage level $V_{in}$, and thus the predetermined load current is supplied to the load L connected between the output terminal OUT and the earth potential.

Thus, if it is assumed that the load current increases in accordance with the variation of the input signal level $V_{in}$ or the value of the load L, the N channel transistor $T_8$ connected to the output terminal OUT will increase the load current flowing from a power supply source $V_{CC}$ through a transistor $T_7$, and as a result, a drain voltage of the transistor $T_8$ will fall.

Further the circuit shown in FIG. 2, comprises a current mirror circuit 3 including the transistor $T_7$ and two transistors $T_4$ and $T_1$ (all of these transistors $T_7$, $T_4$, and $T_1$ are P channel type transistors having gates connected to a drain of the transistor $T_7$), and a current having a value proportional to the load current flowing through the transistor $T_7$ flows through each of the transistors $T_4$ and $T_1$. In this connection, the ratio between each current value flowing through each of these transistors $T_7$, $T_4$, and $T_1$ is determined by the ratio between the size (namely, each current amplification factor $\beta$) of each of these transistors $T_7$, $T_4$, and $T_1$.

Thus, when the load current increases, the gate voltage of each of these transistors $T_7$, $T_4$, and $T_1$ constructing the current mirror circuit 3 (namely, a drain voltage of the transistor $T_8$) falls, and the current flowing through the P channel transistor $T_4$ increases. As a result, a drain voltage of the transistors $T_4$ and $T_5$ (namely, the gate voltage of each pair of transistors $T_5$ and $T_8$) rises. Thus, the gate voltage of each of the N channel transistors $T_5$ and $T_8$ rises in accordance with the increased load current, and is regulated so as to compensate for the insufficiency of the gate bias voltage.

As above-mentioned, if the value of the load current increases in accordance with the input signal level $V_{in}$ or the value of the load L, the current supplied from the power supply source $V_{CC}$ increases, and similarly, if the value of the load current decreases, the current supplied from the power supply source $V_{CC}$ decreases.

Also, the current flowing through the transistor $T_1$ constructing the current mirror circuit 3 becomes equal to the current flowing through the transistor $T_4$ (if it is assumed that the sizes (namely, each current amplification factor) of each of the transistors $T_1$ and $T_4$ are all equal), and this equal current flows through the N channel transistors $T_2$ and $T_3$.

In this connection, the circuit shown in FIG. 2 also comprises another current mirror circuit 4 including the transistor $T_3$ and a transistor $T_6$ (both transistors are N channel type transistors), and the value of the current flowing through the transistor $T_6$ becomes equal to that flowing through the transistor $T_3$, if it is assumed that the sizes (namely, each current amplification factor) of each of these transistors $T_3$ and $T_6$ are equal. As a result, almost all of the current flowing through the transistors $T_4$ and $T_5$ toward the source of the transistor $T_5$ (namely, toward the input terminal) flows into the transistor $T_6$. In other words, the value of the current flowing into the input terminal IN or flowing out of the input terminal IN becomes almost zero in a usual mode, and thus it is possible to remarkably increase the input impedance of the analog buffer amplifier circuit in a usual mode and to reduce the drive ability or capacity of the system provided for driving the analog buffer amplifier.

In this connection, although it is not always necessary to provide the transistor $T_2$ connected in series to the transistor $T_1$, the circuit shown in FIG. 2 is provided with the transistor $T_2$ to ensure a balance in each circuit which is provided with each of the transistors $T_5$ and $T_2$, and thus it is possible to obtain a highly accurate circuit.

As above-mentioned, it is possible to regulate the value of the current supplied from the power supply source in accordance with the value of the load current, and to obtain a semiconductor integrated circuit comprising a low-power analog buffer amplifier which does not waste power.

Figure 3:
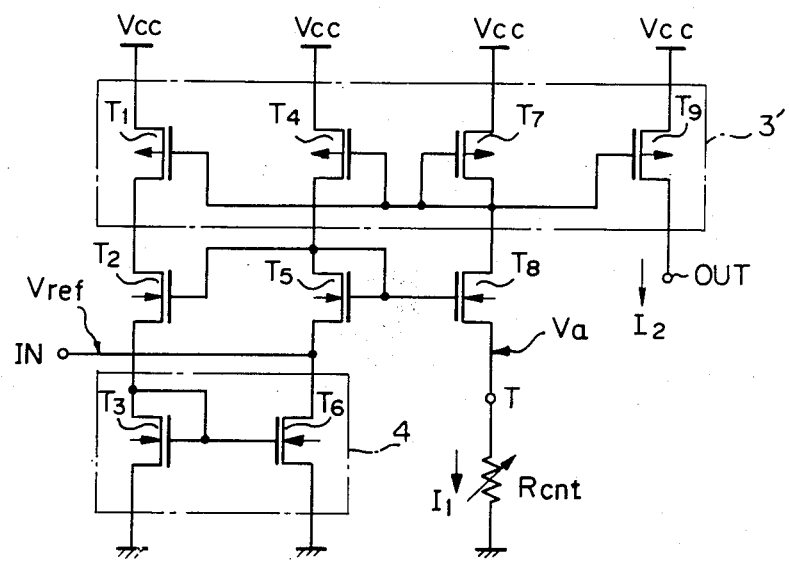
FIG. 3 is a circuit diagram illustrating a second embodiment of the semiconductor integrated circuit according to the present invention.

FIG. 3 shows a circuit diagram illustrating a second embodiment of the semiconductor integrated circuit according to the present invention, which comprises a constant current output circuit utilizing the above analog buffer amplifier. In FIG. 3, members identical to those of FIG. 2 are represented by the same reference numerals or characters (as in all later figures.)

As shown in FIG. 3, the semiconductor integrated circuit according to the second embodiment of the present invention, comprises a pair of N channel transistors $T_5$ and $T_8$ having gates connected to a drain of the transistor $T_5$, and the predetermined constant reference voltage $V_{ref}$ (D.C. bias voltage) is supplied to the input terminal IN connected to the source of the transistor $T_5$. As a result, the output voltage level $V_a$ obtained from the source of the transistor $T_8$ (namely, from a terminal T to which a variable resistor $R_{cnt}$ is connected) becomes equal to the above reference voltage level $V_{ref}$ applied to the input side. In this connection, the above variable resistor $R_{cnt}$ is connected to the above terminal T from outside of the chip on which the above integrated circuit is provided, and thus the value of the current $I_1$ flowing through the variable resistor $R_{cnt}$ becomes equal to the value of $V_a/R'$ (namely, the value of $V_{ref}/R'$), where $R'$ corresponds to the resistance value of the above variable resistor $R_{cnt}$.

Further, the circuit shown in FIG. 3, comprises a current mirror circuit 3' including a P channel type transistor $T_9$ having a drain connected to a terminal OUT for outputting a predetermined constant current, and the other P channel transistors $T_1$, $T_4$, and $T_7$. Thus, if it is assumed that the value of the current flowing through the transistor $T_7$ is $I_1$, the value $I_2$ of the current flowing through the transistor $T_9$ (namely, the current obtained from the constant current output terminal OUT) is determined by the following equation, $$I_2 = \frac{\beta_9}{\beta_7} I_1 = \frac{\beta_9}{\beta_7} \times \frac{V_a}{R'} = \frac{\beta_9}{\beta_7} \times \frac{V_{ref}}{R'},$$

where each of $\beta_7$ and $\beta_9$ is the current amplification factor of each of the transistors $T_7$ and $T_9$.

In this connection, the current amplification factor $\beta$ is a parameter representing a needed drive ability or capacity of a transistor and is a constant value determined by the size of the transistor, electron mobility, and thickness of a gate oxide layer of the transistor, and so on.

Therefore, if the reference voltage $V_{ref}$ is set to the predetermined constant value, the value $I_2$ of the current obtained from the terminal OUT is determined only by the resistance value R' of the variable resistor $R_{cnt}$. As a result, it is possible to obtain a constant current source able to output the predetermined constant current $I_2$ controlled only by the resistance value R' of the variable resistor $R_{cnt}$ and having a very high accuracy and stability, which resistor $R_{cnt}$ is connected from outside of the chip to the above terminal T.

Figure 6:
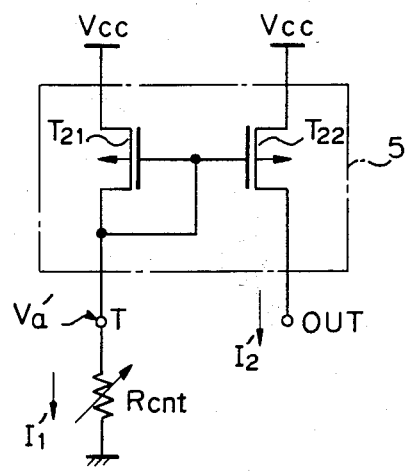

In this connection, a circuit such as shown in FIG. 6 is generally known as a constant current output circuit able to output the predetermined constant current by using a variable resistor $R_{cnt}$ connected from outside of the chip to a terminal T.

As shown in FIG. 6, the circuit comprises a current mirror circuit 5 including a pair of P channel transistors $T_{21}$ and $T_{22}$ having gates connected to a drain of the transistor $T_{21}$, and the variable resistor $R_{cnt}$ is connected to a drain of the transistor $T_{21}$ (namely, to a terminal T for connecting the variable resistor), and a terminal OUT for outputting the predetermined constant current $I_2'$ is connected to a drain of the transistor $T_{22}$.

Thus, the value $I_2'$ of the current output from the terminal OUT becomes proportional to the value $I_1'$ of the current flowing through the variable resistor $R_{cnt}$ (namely, the value of $V_a'/R'$, where $V_a'$ is a voltage level of a drain of the transistor $T_{21}$, and R' is a resistance value of the variable resistor $R_{cnt}$). However, the voltage level $V_a'$ becomes equal to the difference value between a power supply voltage $V_{CC}$ and a threshold voltage $V_{th}$ of the transistor $T_{21}$, and thus the value of the level $V_a'$ varies in accordance with the variation of the threshold voltage $V_{th}$. As a result, the above current value $I_2'$ also varies in accordance with the variation of the threshold voltage $V_{th}$, and therefore, in a circuit as shown in FIG. 6, it is difficult to obtain an output current with a high accuracy.

Contrary to this, according to the above-mentioned circuit of the present invention as shown in FIG. 3, it is possible to output the predetermined constant current with a high accuracy and stability, and to obtain a semiconductor integrated circuit comprising a constant current source of low power (namely, a constant current source consuming only little power).

As above-mentioned, in the circuits according to the first and second embodiments of the present invention as shown in FIG. 2 and FIG. 3, MOS transistors are used as the transistors $T_1$ to $T_9$. It is not always necessary to use MOS transistors as these transistors $T_1$ to $T_9$, and bipolar transistors, for example, can be used instead of these MOS transistors.

Figure 4:
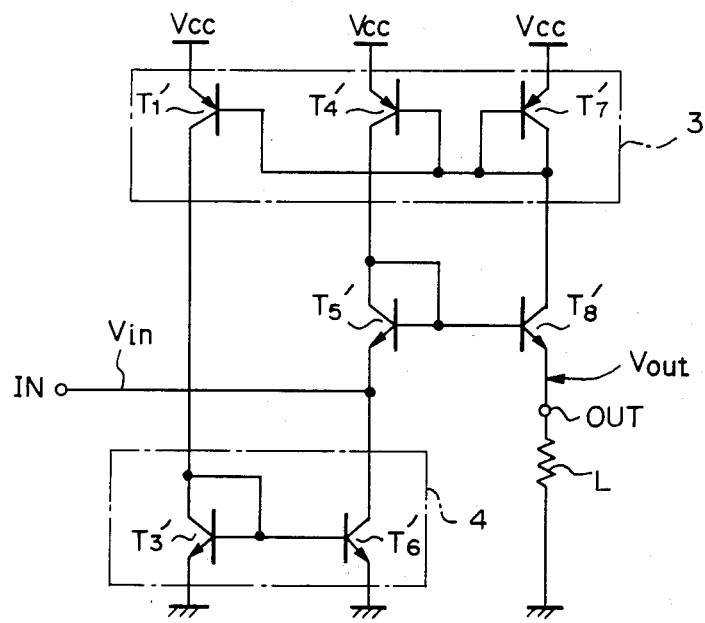
FIG. 4 is a circuit diagram illustrating a third embodiment of the semiconductor integrated circuit according to the present invention.

FIG. 4 shows a circuit diagram illustrating a third embodiment of the semiconductor integrated circuit according to the present invention, which comprises bipolar tansistors $T_1'$ to $T_8'$ corresponding to the MOS transistors $T_1$ to $T_8$ shown in FIG. 2. The operation of the circuit shown in FIG. 4, is the same as that of the circuit shown in FIG. 2.

Figure 5:
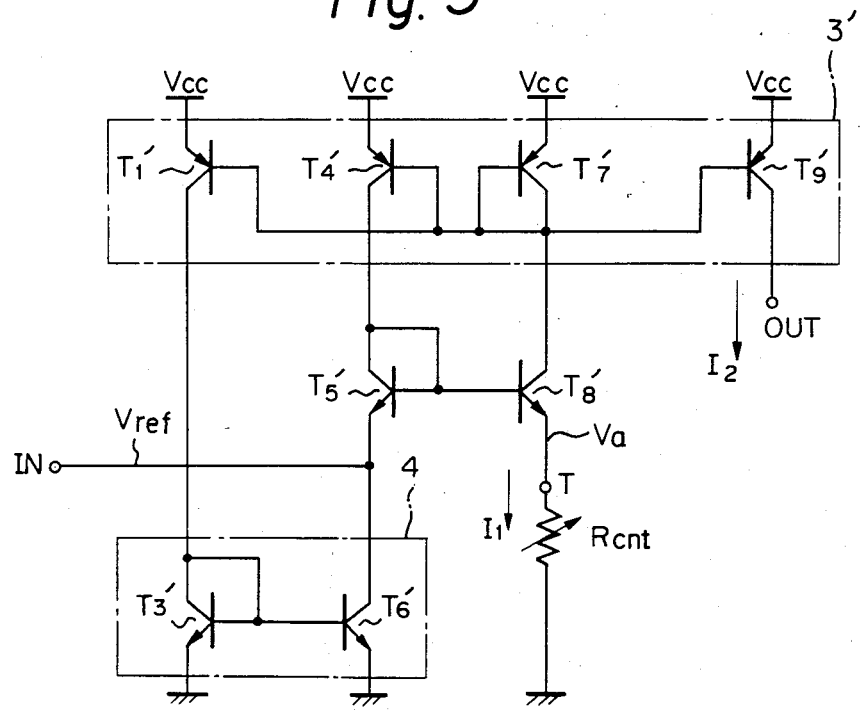
FIG. 5 is a circuit diagram illustrating a fourth embodiment of the semiconductor integrated circuit according to the present invention; and, FIG. 6 is a circuit diagram illustrating an example of a conventional constant current output circuit.

FIG. 5 shows a circuit diagram illustrating a fourth embodiment of the semiconductor integrated circuit according to the present invention, which comprises bipolar transistors $T_1'$ to $T_9'$ corresponding to the MOS transistors $T_1$ to $T_9$ shown in FIG. 3. The operation of the circuit shown in FIG. 5, is the same as that of the circuit shown in FIG. 3.

In this connection, as above-mentioned, it is not always necessary to provide the transistor $T_2$ in each of the circuits shown in FIG. 2 and FIG. 3, and therefore, in each of the circuits shown in FIG. 4 and FIG. 5, the above transistor $T_2$ is not provided.

As described above, according to the semiconductor integrated circuit of the present invention, it is possible to obtain a low-power analog buffer amplifier able to regulate the current supplied from the power supply source in accordance with the value of the load driven by the analog buffer amplifier, and to lower the power consumption. Simultaneously, according to the circuit of the present invention, it is not necessary to provide a capacitor in the circuit for correcting the phase, and thus it is possible to reduce the total area needed for the layout of the semiconductor integrated circuit.

Further, according to the semiconductor integrated circuit of the present invention, it is possible to obtain a constant current output circuit having not only the same advantages as those of the above analog buffer amplifier, but also able to output a predetermined constant current with a high accuracy and stability.

We claim:

1. A semiconductor integrated circuit, comprising:
    first and second power supply terminal means for supplying power;
    first and second transistors each having a gate and the gates being connected in common, each having a drain and the drain of said first transistor being connected to the gates of said first and second transistors and each having a source;
    input terminal means and output terminal means for providing an output and said input and output terminal means being connected to the respective sources of said first and second transistors;
    a first current mirror circuit comprising third, fourth, and fifth transistors each having a gate and the gates being connected in common, each having a source and the sources of said third, fourth, and fifth transistors connected to said first power supply terminal means, each having a drain, the drain of said third transistor being connected to the drain of said first transistor, the gates of said third, fourth, and fifth transistors and the drain of said fourth transistor being connected to the drain of said second transistor; and
    a second current mirror circuit comprising sixth and seventh transistors, said sixth transistor being connected between said input terminal means and said second power supply terminal means, and said seventh transistor being connected between the drain of said fifth transistor and said second power supply terminal means.

2. A circuit as recited in claim 1, further comprising an eighth transistor connected between said fifth and seventh transistors.

3. A semiconductor integrated circuit, comprising:
    first and second power supply terminal means for supplying power;
    first and second transistors each having a gate and the gates being connected in common, each having a drain and the drain of said first transistor being connected to the gates of said first and second transistors and each having a source;
    an input terminal means and a first terminal means for providing a terminal, said input and first terminal means being respectively connected to the sources of said first and second transistors;
    a variable resistor connected between said first terminal means and said second power supply terminal means;
    a first current mirror circuit having an output terminal means for producing an output, and comprising third, fourth, fifth, and sixth transistors each having a gate and the gates being connected in common, each having a source and the sources of said third, fourth, fifth and sixth transistors being connected to said first power supply terminal means, each having a drain and the drain of said third transistor being connected to the drain of said first transistor, the gates of said third, fourth, fifth and sixth transistors and the drain of said fourth transistor being connected to the drain of said second transistor, and the drain of said sixth transistor being connected to said output terminal means; and a second current mirror circuit comprising seventh and eight transistors, said seventh transistor being connected between said input terminal means and said second power supply terminal means, and said eighth transistor being connected between a drain of said fifth transistor and said second power supply terminal means.

4. A circuit as recited in claim 3, further comprising a ninth transistor connected between said fifth and seventh transistors.

* * * * *